US010868563B2

(12) United States Patent
Onishi

(10) Patent No.: US 10,868,563 B2
(45) Date of Patent: Dec. 15, 2020

(54) METHODS AND APPARATUS FOR AN ANALOG-TO-DIGITAL CONVERTER

(71) Applicant: SEMICONDUCTOR COMPONENTS INDUSTRIES, LLC, Phoenix, AZ (US)

(72) Inventor: Akinobu Onishi, Ota (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/455,114

(22) Filed: Jun. 27, 2019

(65) Prior Publication Data

US 2020/0295777 A1   Sep. 17, 2020

Related U.S. Application Data

(60) Provisional application No. 62/817,837, filed on Mar. 13, 2019.

(51) Int. Cl.
*H03M 3/00* (2006.01)

(52) U.S. Cl.
CPC .......... *H03M 3/464* (2013.01); *H03M 3/422* (2013.01); *H03M 3/494* (2013.01); *H03M 3/438* (2013.01)

(58) Field of Classification Search
None
See application file for complete search history.

(56) References Cited

U.S. PATENT DOCUMENTS

| | | | | |
|---|---|---|---|---|
| 5,030,954 A | * | 7/1991 | Ribner | H03M 3/47 341/143 |
| 5,392,043 A | * | 2/1995 | Ribner | H03M 3/342 341/143 |
| 5,982,315 A | * | 11/1999 | Bazarjani | H03M 3/418 341/143 |
| 2006/0267823 A1 | | 11/2006 | Pinna et al. | |
| 2008/0062024 A1 | * | 3/2008 | Maeda | H03M 3/374 341/143 |

OTHER PUBLICATIONS

Wang et al., A Low Power Audio Delta-Sigma Modulator with pamp-Shared and Opamp-Switched Techniques, International MultiConfernece of Engineers and Computer Scientist 2010 vol. 2 IMECS 2010, Mar. 17-19, 2010, Hong Kong.*

* cited by examiner

*Primary Examiner* — Howard Williams
(74) *Attorney, Agent, or Firm* — The Noblitt Group, PLLC; Hettie L. Haines

(57) ABSTRACT

Various embodiments of the present technology may comprise methods and apparatus for an analog-to-digital converter. Methods and apparatus for an analog-to-digital converter (ADC) may be configured as a delta-sigma type ADC and include an integrator circuit formed using two switched-capacitor (SC) circuits that share a single operational amplifier. The switched-capacitor circuits receive various control signals such that one SC circuit performs sampling while the other SC circuit simultaneously performs integration.

18 Claims, 20 Drawing Sheets

METHODS AND APPARATUS FOR AN ANALOG-TO-DIGITAL CONVERTER

CROSS-REFERENCE TO RELATED APPLICATIONS

This application claims the benefit of U.S. Provisional Patent Application No. 62/817,837, filed on Mar. 13, 2019, the entire contents of which is incorporated herein by reference.

BACKGROUND OF THE TECHNOLOGY

Analog-to-digital converters (ADCs) are utilized in a variety of electronic devices and systems to transform an analog signal to a digital signal. One ADC architecture commonly used is the delta-sigma type ADC. The differentiating aspects of the delta-sigma type ADCs include the use of oversampling in conjunction with decimation filtering and quantization noise shaping. Advantageous characteristics of the delta-sigma type ADC include high resolution and high stability. Due to these characteristics, the delta-sigma type ADCs are frequently chosen for use in audio systems, such as hearing devices, microphones, and the like.

Many audio applications require high-resolution audio, which requires that the operating frequency of the ADC be at least twice as high as the standard frequency. To achieve high-resolution audio in a conventional ADC, the current must be increased, which also increases the power consumption. Accordingly, conventional ADCs are unable to provide high-resolution performance while maintaining particular design specifications, such as low power consumption, low current, a high signal-to-noise ratio (SNR), and a low total harmonic distortion (THD). This is, in part, due to the operating characteristics of the operational amplifiers ("op-amps"), which are commonly utilized in delta-sigma type ADCs.

SUMMARY OF THE INVENTION

Various embodiments of the present technology may provide methods and apparatus for an analog-to-digital converter. Methods and apparatus for an analog-to-digital converter (ADC) may be configured as a delta-sigma type ADC and include an integrator circuit formed using two switched-capacitor (SC) circuits that share a single operational amplifier. The switched-capacitor circuits receive various control signals such that one SC circuit performs sampling while the remaining SC circuit simultaneously performs integration.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various filters, amplifiers, signal converters, signal processors, and semiconductor devices, such as transistors, capacitors, and the like, which may carry out a variety of functions. In addition, the present technology may be practiced in conjunction with any number of electronic systems, such as automotive, aviation, "smart devices," portables, and consumer electronics, and the systems described are merely exemplary applications for the technology. Further, the present technology may employ any number of conventional techniques for quantization, clock signal generation, and the like.

Methods and apparatus for an analog-to-digital converter according to various aspects of the present technology may operate in conjunction with any suitable electronic system, such as an audio system, a microphone system, a video telephone, an acoustics system, hearing devices, and the like.

Figure 1:
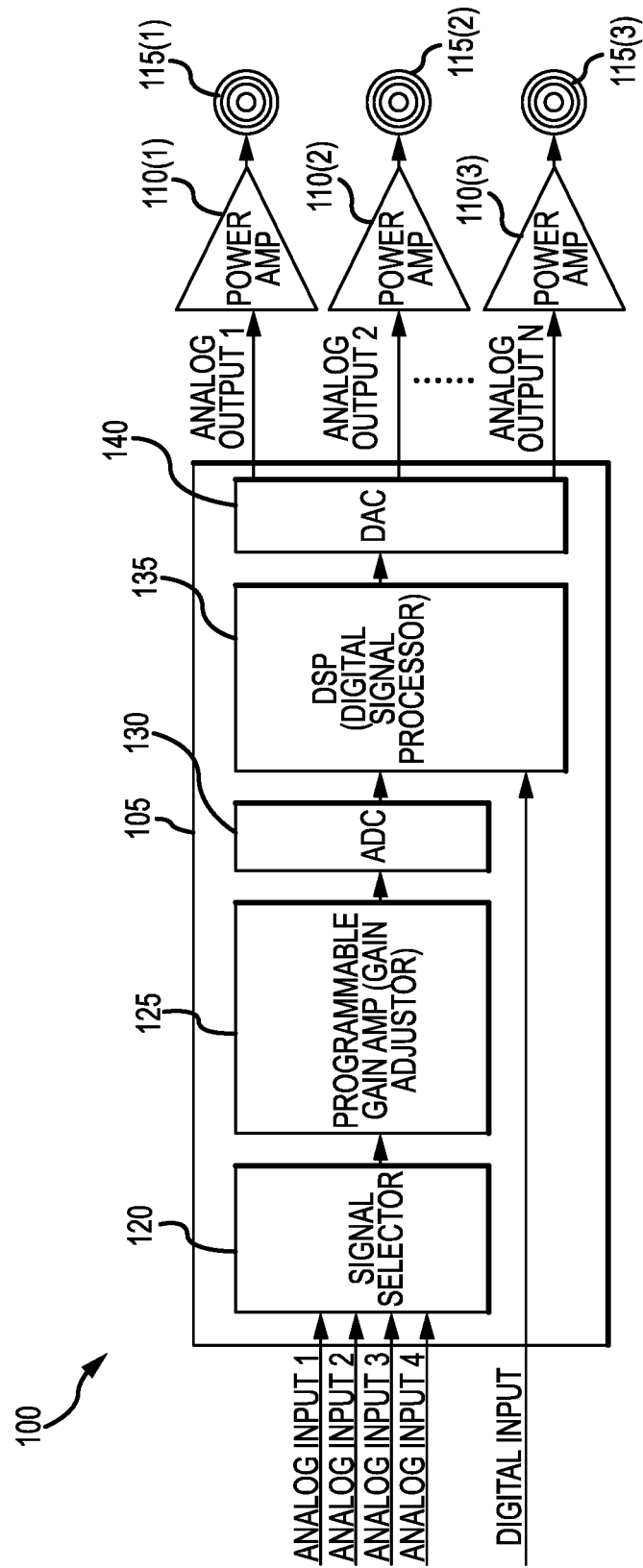
FIG. 1 is a block diagram of an audio system in accordance with an exemplary embodiment of the present technology.

Referring to FIG. 1, an electronic device and/or system according to various aspects of the present technology may comprise an audio system 100 configured to detect and process sound. For example, the audio system 100 may receive one or more analog input signals and/or digital signals, generate one or more analog output signals, and convert the analog output signals to sound. According to an exemplary embodiment, the audio system 100 may comprise an integrated circuit (IC) 105, a power amplifier 110, and a speaker 115.

In general, the audio system 100 may be described according to various characteristics, such a signal-to-noise ratio (SNR), a dynamic range DR, and a total harmonic distortion (THD). The SNR may be described as follows:

$$SNR[\text{dB}] = 20 \times \log\left(\frac{\text{signal}}{\text{noise}}\right). \quad \text{(Equation 1)}$$

The dynamic range DR may be described as follows:

$$DR\,[\text{dB}] = |THD+N| + 60$$

(Equation 2), where THD+N is the total harmonic distortion with noise at −60 dBFS input signal.
The THD with noise may be described as follows:

$$THD + N[\text{dB}] = \quad \text{(Equation 3)}$$
$$20 \times \log\left(\frac{\sqrt{HD_2^2 + HD_3^2 + HD_4^2 + \ldots + HD_n^2 + \text{noise}^2}}{\text{signal}}\right),$$

where $HD$ is a harmonic distortion component

The IC 105 may process the one or more input analog and/or digital signals. For example, the IC 105 may comprise a signal selector 120 to select one of various analog input signals, a gain adjustor circuit 125, such as a programmable gain amplifier to adjust a gain of the selected analog input signal, an analog-to-digital converter (ADC) 130 to convert the selected analog input signal into a digital signal, a digital signal processor (DSP) 135 to process digital signals, and a digital-to-analog converter (DAC) 140 to convert the digital signal from the DSP 135 into the analog output signal. The IC 105 may transmit the analog output signal to the power amplifier 110, wherein the power amplifier 110 amplifies the analog output signal. The power amplifier 110 may then transmit the analog output signal to the speaker 115, wherein the speaker 115 converts the analog signal into a sound wave.

Figure 2:
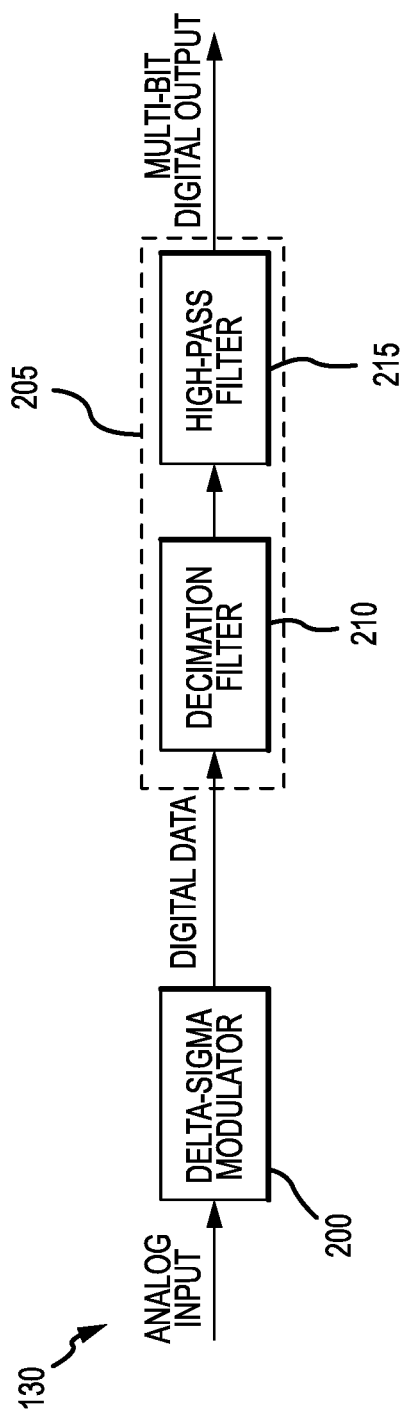
FIG. 2 is a block diagram of an analog-to-digital converter in accordance with an exemplary embodiment of the present technology.

Referring to FIG. 2, in an exemplary embodiment, the ADC 130 may be configured as a delta-sigma type ADC and comprise a delta-sigma modulator 200 and a digital circuit 205. The delta-sigma modulator 200 may receive an analog input and generate digital data.

The digital circuit 205 may be configured to process the digital data. The digital circuit 205 may be connected to an output of the delta-sigma modulator 200 and receive the digital data. The digital circuit 205 may comprise a first filter 210, such as a decimation filter 210 and a second filter 215, such as a high-pass filter to remove signals below a predetermined frequency. In addition, the decimation filter 210 and the second filter 215 may operate together to perform noise shaping and sampling functions. The digital circuit 205 may be formed on the same chip as the IC 105 or on a companion chip.

In general, the ADC 130 may operate according to a reference clock ADC_CLK having a particular frequency.

Figure 3:
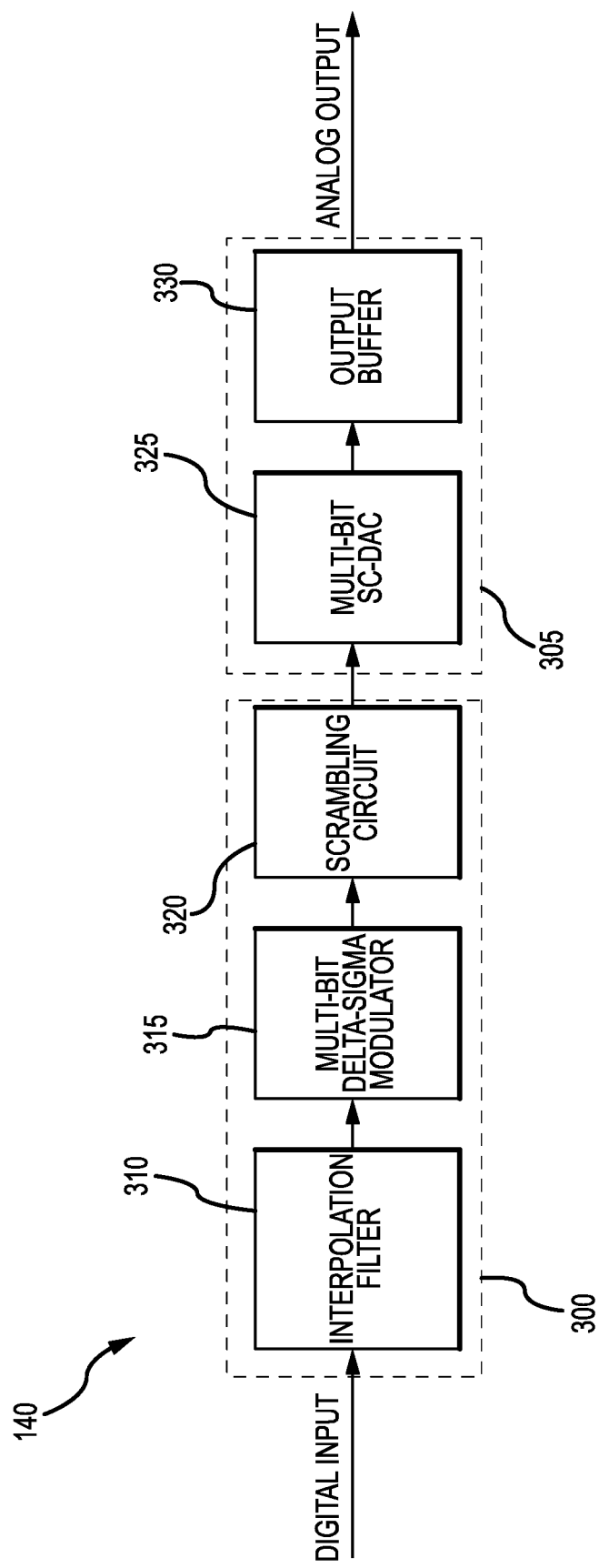
FIG. 3 is a block diagram of a digital-to-analog converter in accordance with an exemplary embodiment of the present technology.

Referring to FIG. 3, the DAC 140 may comprise a digital circuit portion 300 to perform digital processing on a multi-bit digital input and an analog circuit portion 305 to perform analog processing. The digital circuit portion 300 may comprise an interpolation filter 310, a modulator circuit 315, such as a multi-bit delta-sigma modulator, and a scrambling circuit 320 that operate together to perform noise shaping and sampling functions. The interpolation filter 310, the modulator circuit 315 and the scrambling circuit 320 operate together to generate multi-bit digital data.

The analog circuit portion 305 may comprise a multi-bit switched-capacitor DAC circuit 325 and an output buffer 330 that operate together to convert a digital signal to an analog signal and provide gain adjustment and/or remove high frequency components of an input analog signal. For example, the output buffer 330 may be configured as a second-order low-pass filter, a multi-feedback type second-order low-pass filter, first-order low-pass filter, or any other suitable architecture and may be of an active type or a passive type. The analog circuit portion 305 may be connected to an output of the digital circuit portion 300.

In various embodiments, and referring to FIGS. 17-20, the delta-sigma modulator (DSM) 200 may be configured to convert an analog input (e.g., input voltages VINP and VINN) into a digital output (e.g., a 1-bit digital value or a multi-bit digital value). For example, the delta-sigma modulator 200 may comprise a plurality of integrators, such as a first integrator 400 connected in series with one or more additional integrators, such as a second integrator 1700, a third integrator 1800, and a fourth integrator 1900. The delta-sigma modulator 200 may further comprise a quantizer 1705.

The delta-sigma modulator 200 may be arranged to have any desirable architecture. For example, the delta-sigma modulator 200 may be configured as a second-order DSM (e.g., FIG. 17), a cascade DSM (e.g., FIG. 18 where the delta-sigma modulator 200 is configured as a third-order cascade DSM), a multi-feedback DSM (e.g., FIG. 19 where the delta-sigma modulator 200 is configured as a fourth-order, multi-feedback DSM), or feed-forward DSM (e.g., FIG. 20 where the delta-sigma modulator 200 is configured as a fourth-order, feed-forward DSM). The particular topology may be selected according to design choices for a particular application. For example, a feed-forward configuration may impose timing constraints for high-speed multi-bit modulators. Further, the order of the delta-sigma modulator 200 may be selected according to desired noise-shaping characteristics.

In various embodiments, one or more integrators may comprise one or more feedback digital-to-analog converters (DACs). For example, and referring to FIGS. 17, 18 and 19, the first integrator 400 comprises one or more DACs (and may be referred to collectively as "DAC1), the second integrator 1700 comprises one or more DACs (and may be referred to collectively as "DAC2"), the third integrator 1800 comprises one or more DACs (and may be referred to collectively as "DAC3"), and the fourth integrator 1900 comprises one or more DACs (and may be referred to collectively as "DAC4").

In an alternative embodiment, subsequent integrators after the first integrator 400 may not comprise feedback DACs. For example, and referring to FIG. 20, subsequent integrators 2000, 2005, and 2010 do not comprise feedback DACs.

Figure 4:
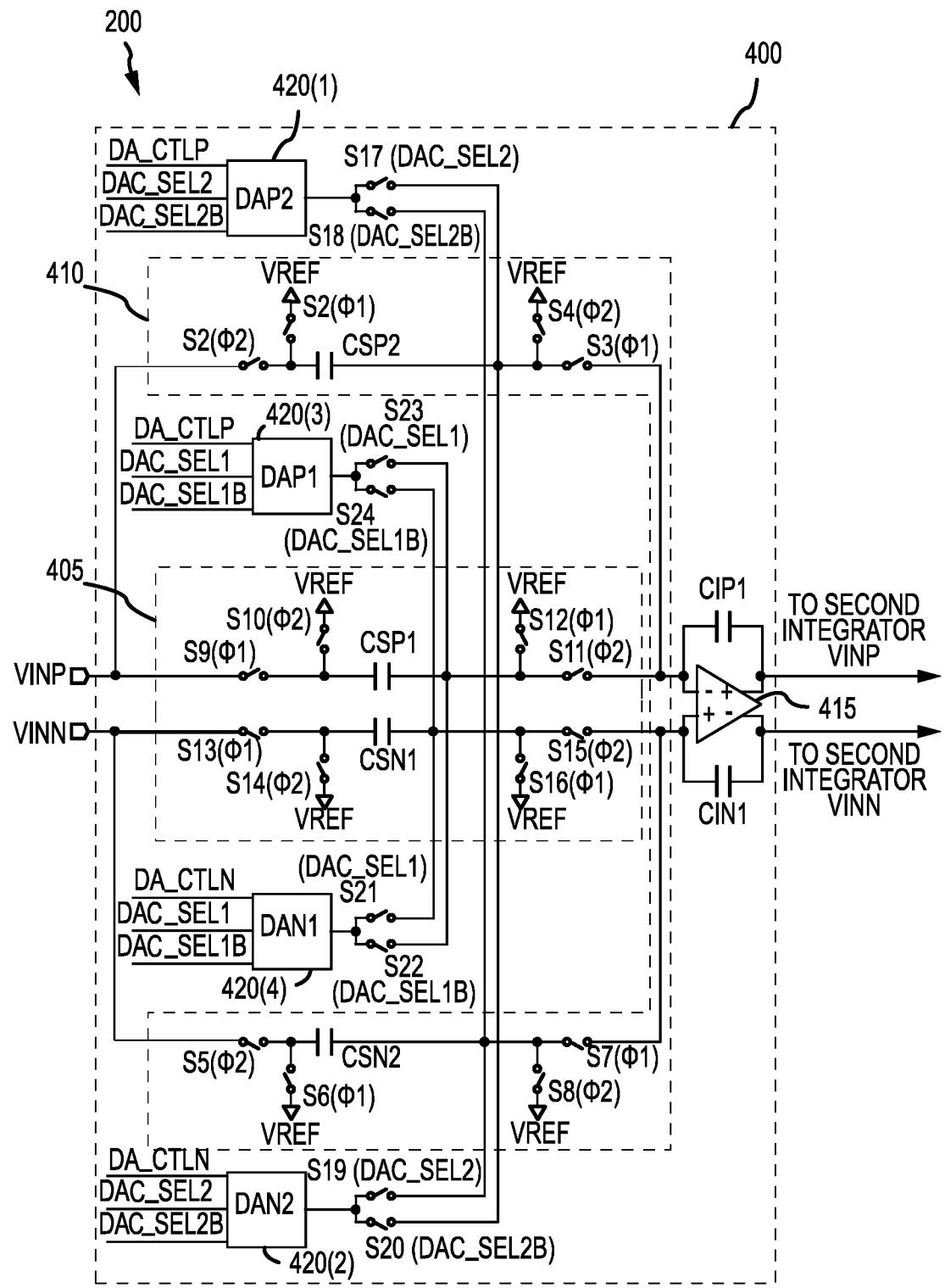
FIG. 4 is a circuit diagram of an integrator circuit in accordance with various embodiments of the present technology.

In various embodiments, and referring to FIG. 4, the first integrator 400 may be configured to simultaneously sample and integrate an input signal. For example, the first integrator 400 may comprise a plurality of switched-capacitor (SC) circuits, such as a first SC circuit 410, a second SC circuit 405, wherein each SC circuit is configured to receive analog input signals VINP, VINN. The first integrator 400 may further comprise an operational amplifier (op-amp) 415 that is shared by both the first and second SC circuits 410, 405.

The first SC circuit 410 may comprise a first plurality of switches, such as switches S1, S2, S3, S4, S5, S6, S7 and S8, and a first plurality of sampling capacitors, such as capacitors CSP2 and CSN2. Similarly, the second SC circuit 405 may comprise a second plurality of switches, such as switches S9, S10, S11, S12, S13, S14, S15 and S16, and a second plurality of sampling capacitors, such as capacitors CSP1 and CSN1. Each switch (e.g., S1:S16) may be responsive to a control signal and operate according to a first phase 11 and second phase 12.

According to various embodiments, the first and second SC circuits 410, 405 are connected to and share a single, operational amplifier, such as the operational amplifier 415. For example, sampling capacitors CSP1 and CSP2 are connected to an inverting input terminal (−) of the op-amp 415 via switches S11 and S3, respectively. Similarly, sampling capacitors CSN1 and CSN2 are connected to a non-inverting input terminal (+) of the op-amp 415 via switches S15 and S7, respectively. The op-amp 415 may comprise a conventional op-amp formed from a plurality of transistors.

In general, to maintain a stable operation, the op-amp 415 must operate at a unity gain frequency that is at least 5 times that of the frequency of the reference clock ADC_CLK. The unity gain frequency is linked to a transconductance of the transistor. In addition, the transconductance of the transistor is proportional to the square root of a drain current of the transistor. Accordingly, when the frequency of the reference clock ADC_CLK doubles, the current through the op-amp 415 increases by 4 times to maintain the stable operation, as described above.

The first integrator 400 may further comprise a plurality of integration capacitors, such as a first integration capacitor CIP1 and a second integration capacitor CIN1. Each integration capacitor CIP1, CIN1 may be coupled between an output terminal of the op-amp 415 and an input terminal. For example, the first integration capacitor CIP1 may be coupled between a positive output terminal (+) and the inverting input terminal (−) while the second integration capacitor CIN1 may be coupled between a negative output terminal (−) and the non-inverting input terminal (+).

In various embodiments, the first integrator 400 may further comprise a plurality of feedback digital-to-analog converters (DAC) 420, such as a first feedback DAC 420(1), a second feedback DAC 420(2), a third feedback DAC 420(3), and a fourth feedback DAC 420(4), that are selectively connected to the SC circuits 410, 405. According to an exemplary embodiment, the first feedback DAC 420(1) may be selectively connected to sampling capacitors CSP2 and CSN2, the second feedback DAC 420(2) may be selectively connected to sampling capacitors CSP2 and CSN2, the third feedback DAC 420(3) may be selectively connected to sampling capacitors CSP1 and CSN1, and the fourth feedback DAC 420(4) may be selectively connected to sampling capacitors CSP1 and CSN1.

Figure 9:
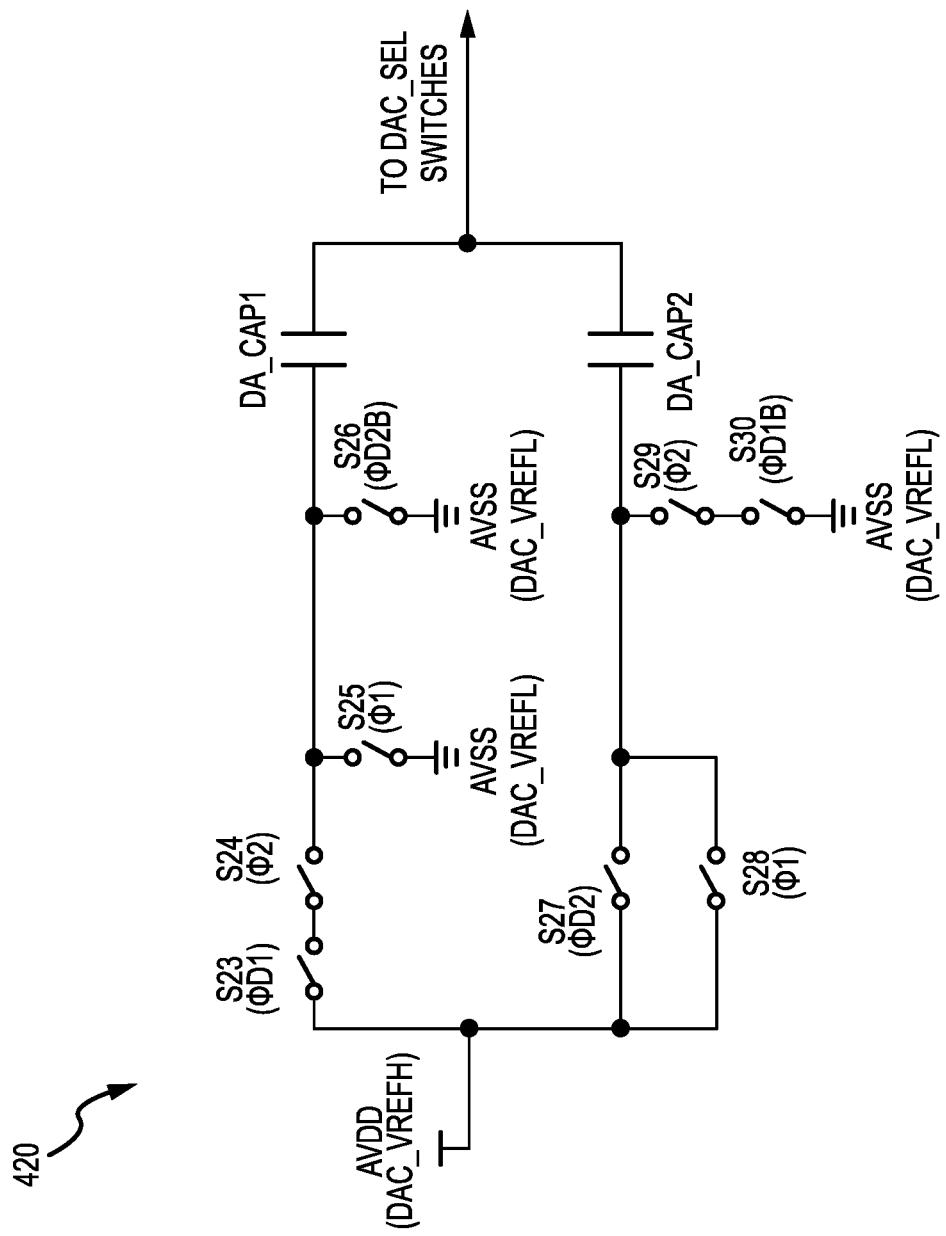
FIG. 9 is a circuit diagram of a variable digital-to-analog converter in accordance with an exemplary embodiment of the present technology.
Figure 10:
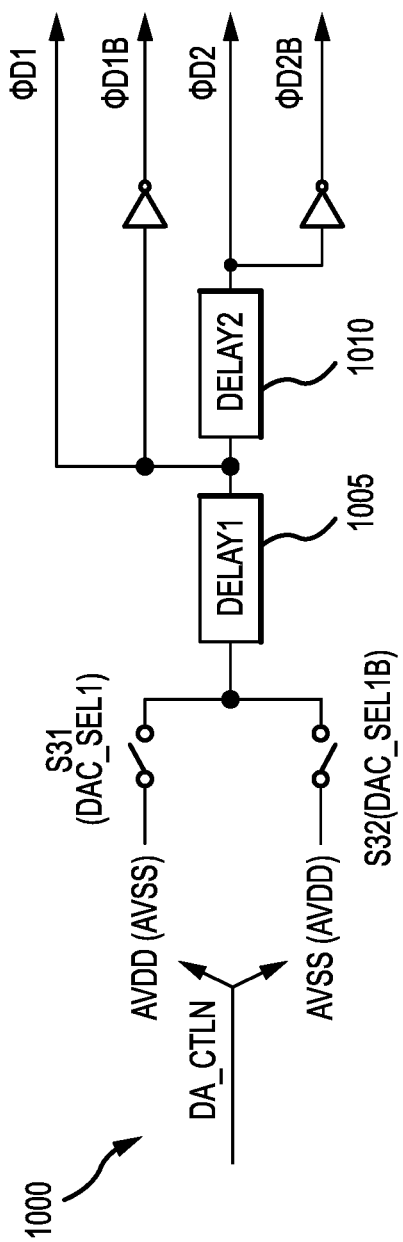
FIG. 10 is a second signal generator circuit in accordance with an exemplary embodiment of the present technology.
Figure 11:
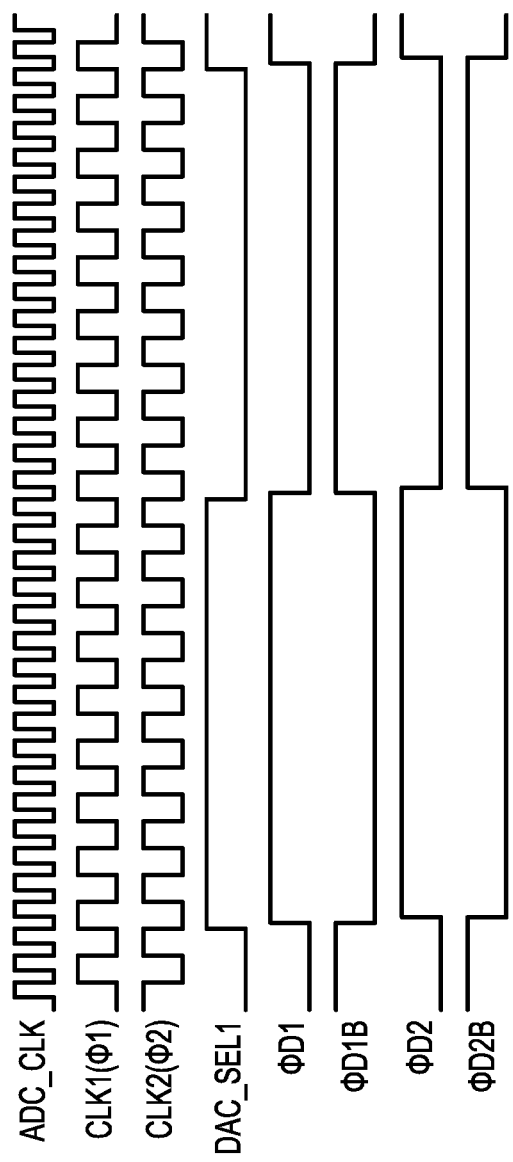
FIG. 11 is a timing diagram of various signals generated by the second signal generator circuit in accordance with an exemplary embodiment of the present technology.

Referring to FIGS. 9-11, each DAC 420 may be responsive to a plurality of select signals, such as a first select signal DAC_SEL1, a second select signal DAC_SEL2, and a control signal DA_CTL(P/N) that may be responsive to an output value of the quantizer 1705. A positive voltage may be associated with the control signal DA_CTLP and a negative voltage may be associated with the control signal DA_CTLN. Alternatively, a positive voltage may be associated with the control signal DA_CTLN and a negative voltage may be associated with the control signal DA_CTLP. In addition, the control signals DA_CTLP and DA_CTLN may have phases that are opposite from each other.

According to an exemplary embodiment, each DAC 420 is configured as a 1-bit DAC and may comprise a plurality of switches, such as switches S23:S30, a first DAC capacitor DA_CAP1, and a second DAC capacitor DA_CAP2. The switches of the DAC 420 may receive and respond to various control signals, such signals Φ1, Φ2, ΦD1, ΦD2, ΦD1B, and ΦD2B.

The audio system 100 may comprise a signal generator circuit 1000 that is responsive to the control signal DA_CTL (P/N) and configured to generate the signals ΦD1, ΦD2, ΦD1B, and ΦD2B according to the control signal DA_CTL (P/N). In an exemplary embodiment, the signal generator circuit 1000 may comprise switches S31 and S32, a first delay circuit 1005, and a second delay circuit 1010. Signals ΦD1 and ΦD1B may be generated by the first delay circuit 1005 and signals ΦD2 and ΦD2B may be generated by the second delay circuit 1010. Signals ΦD1 and ΦD1B may have opposite timing from each other and signals ΦD2 and ΦD2B may have opposite timing from each other. Signals ΦD1 and ΦD2 may have a slight offset of timing from each other and signals ΦD1B and ΦD2B may have a slight offset of timing from each other, as illustrated in FIG. 11.

In various embodiments, and referring to FIGS. 4, 5, 9 and 10, the first integrator 400 may further comprise a plurality of feedback switches, such as switches S17:S24. Each feedback switch may be responsive to a select signal, such as the first select signal DAC_SEL1, the second select signal DAC_SEL2, a third select signal DAC_SEL1B, and a fourth select signal DAC_SEL2B. According to an exemplary embodiment, the third select signal DAC_SEL1B has an opposite phase of the first select signal DAC_SEL1 and the fourth select signal DAC_SEL2B has an opposite phase of the second select signal DAC_SEL2. In addition, the first select signal DAC_SEL1 and the second select signal DAC- _SEL2 may generate a different particular periodic signal each according to the reference clock ADC_CLK.

In an exemplary embodiment, each feedback DAC 420 is selectively connected to the first and/or second SC circuits 410, 405 via two feedback switches from the plurality of feedback switches. In other words, two feedback switches are connected between an output terminal of one feedback DAC 420 and two sampling capacitors. Accordingly, operation of the feedback switches selectively connects a feedback DAC 420 to one or more sampling capacitors, as described above. These selective connections can be effective for the suppression of characteristic deterioration caused by a capacitor mismatch of the feedback DACs 420.

The second integrator 1700 may be similarly configured as the first integrator 400 and capable of simultaneously performing integration and sampling. For example, the second integrator 1700 may comprise two switched-capacitor circuits, comprising switches and capacitors (arranged similarly as the first integrator 400), which share a single op-amp (e.g., the op-amp 415(2)). The second integrator 1700 may further comprise a plurality of feedback DACs, such as feedback DACs 1720(1), 1720(2), 1720(3), 1720(4). The feedback DACs 1720 may be responsive to the control signal DA_CTL(P/N). The feedback DACs 1720 may be directly connected to sampling capacitors, such as sampling capacitors CSP3, CSN3, CSP4, CSN4.

According to an exemplary embodiment, the third and fourth integrators 1800, 1900 have the same, or substantially the same, configuration as the second integrator 1700.

Figure 17:
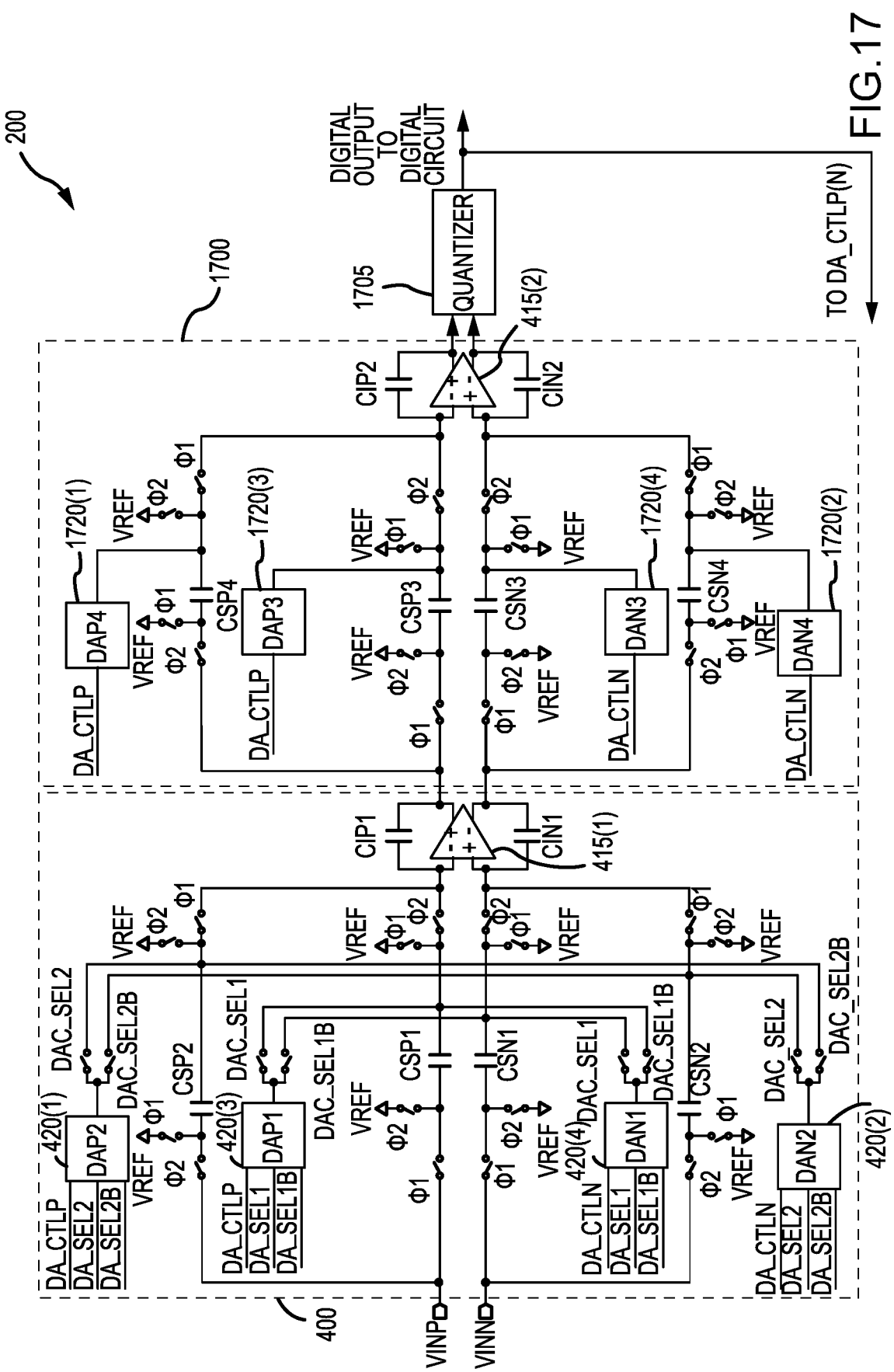
FIG. 17 is circuit diagram of a delta-sigma modulator circuit in accordance with a first embodiment of the present technology.
Figure 18:
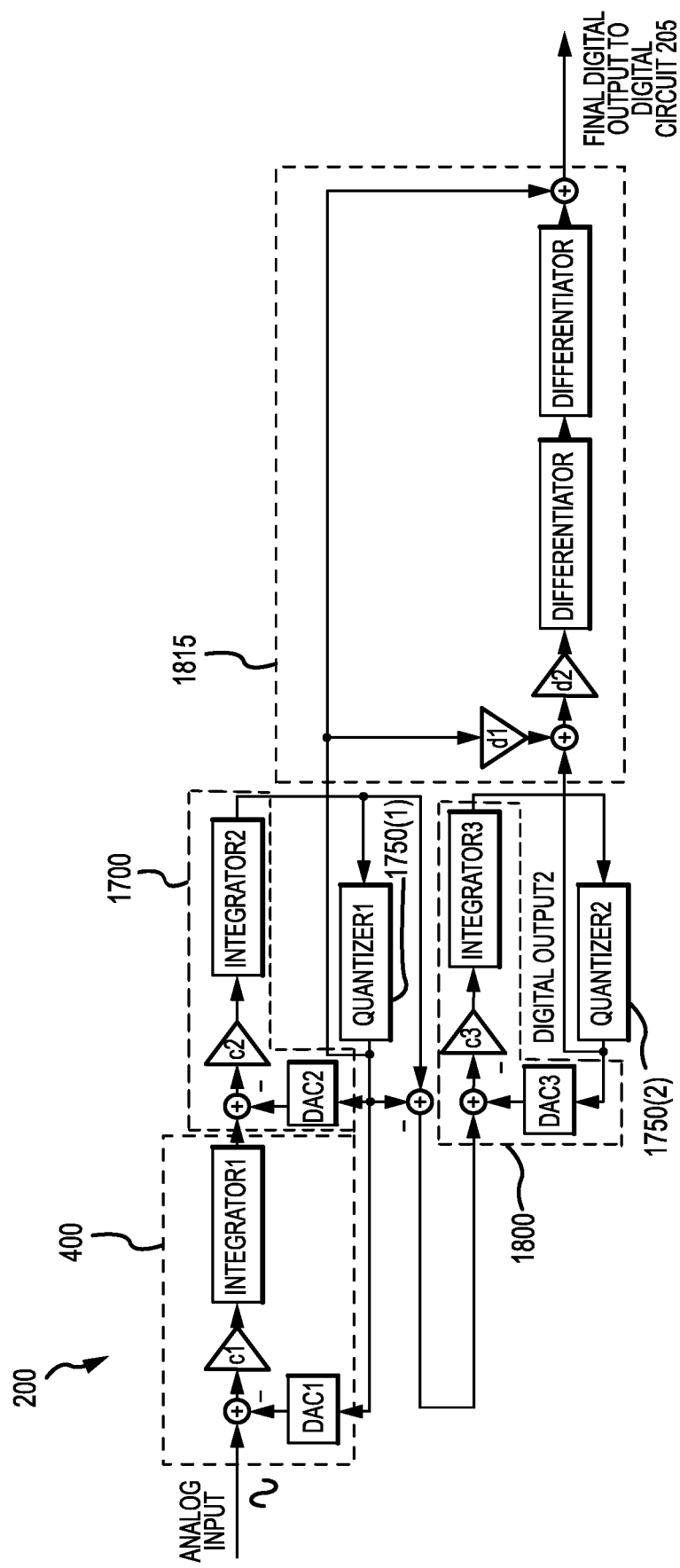
FIG. 18 is a block diagram of the delta-sigma modulator circuit in accordance with a second embodiment of the present technology.
Figure 19:
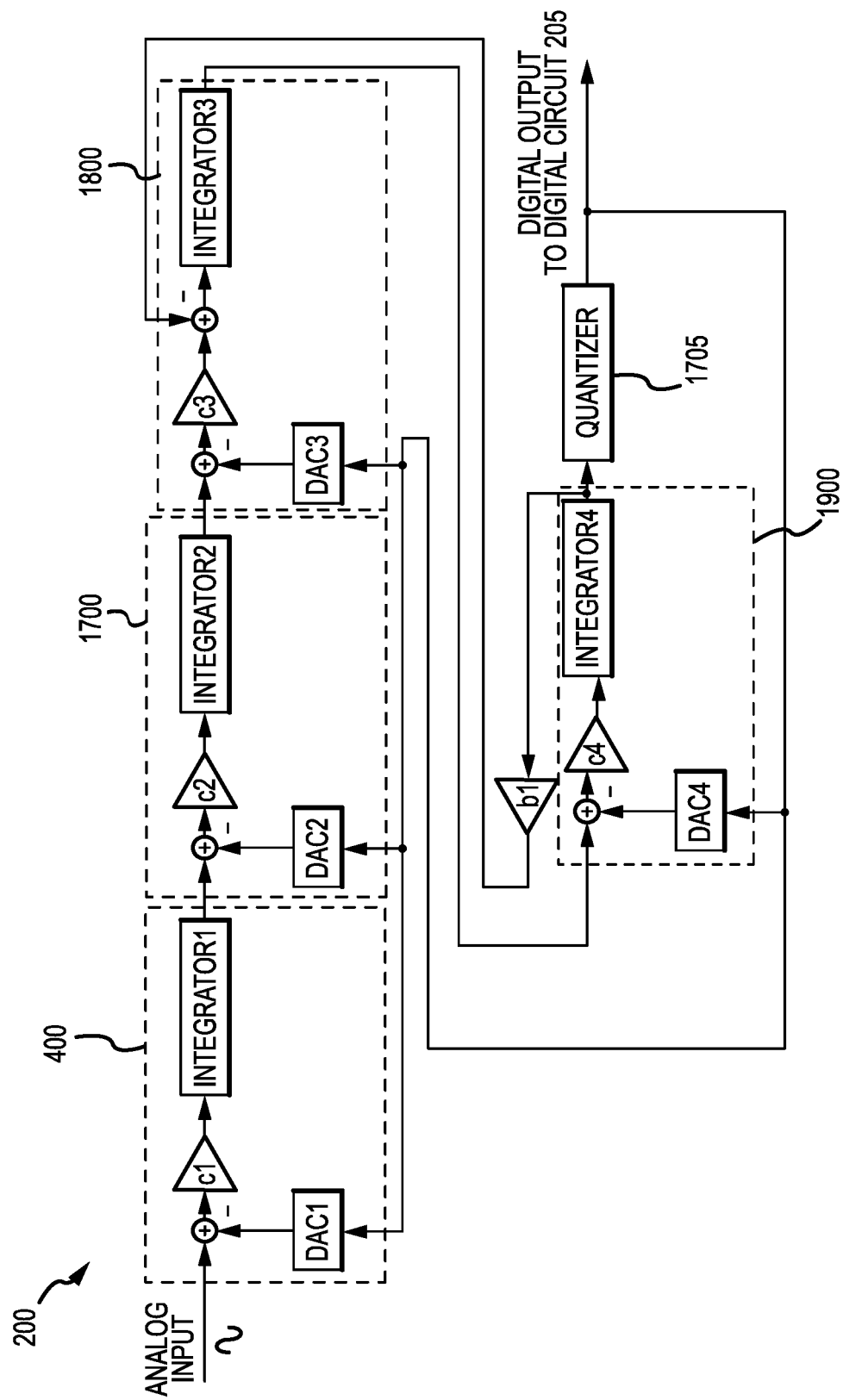
FIG. 19 is a block diagram of the delta-sigma modulator circuit in accordance with a third embodiment of the present technology.
Figure 20:
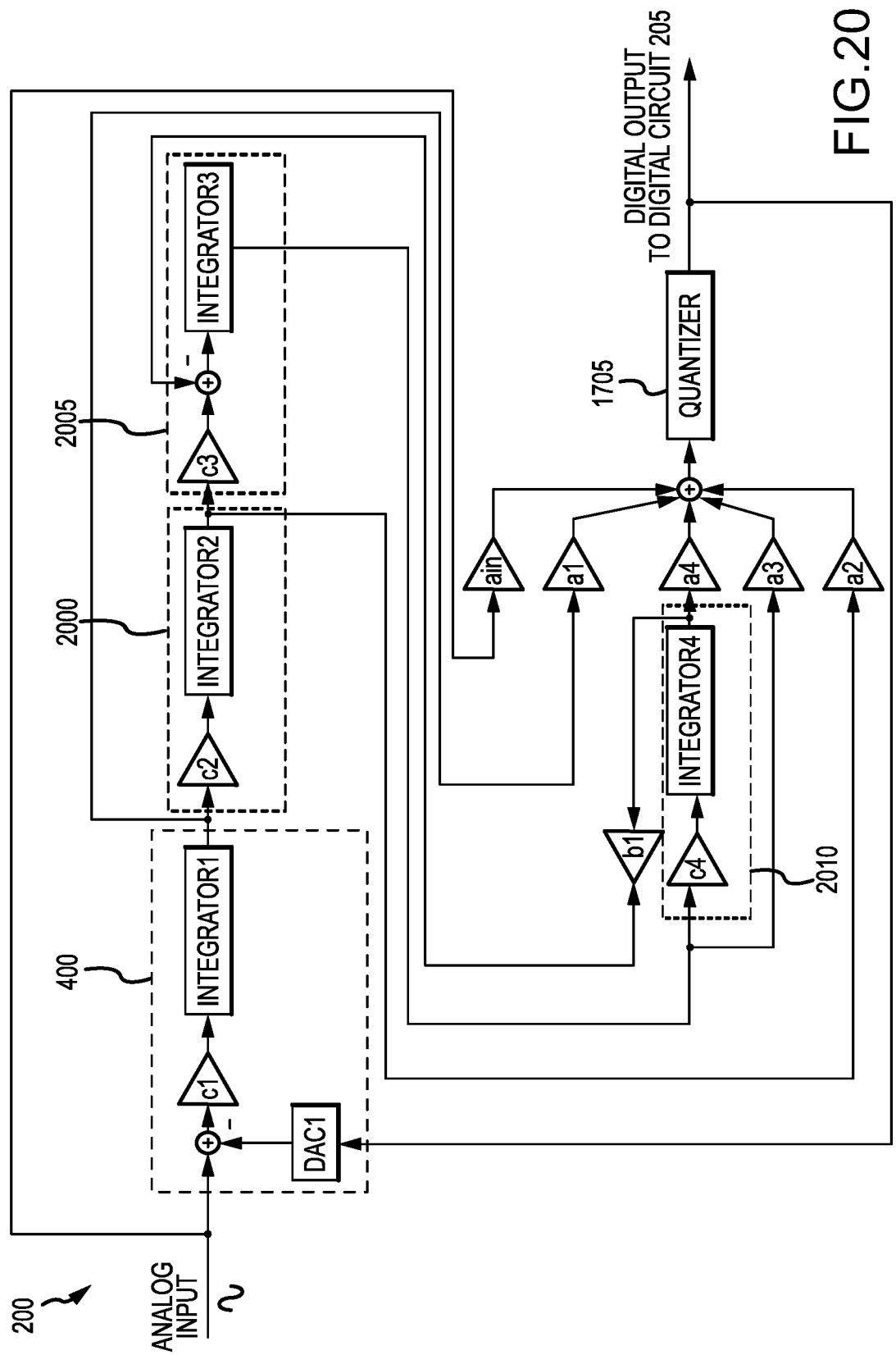
FIG. 20 a block diagram of the delta-sigma modulator circuit in accordance with a fourth embodiment of the present technology.

The quantizer 1705 may be configured to convert an input voltage to a digital value. The quantizer 1705 may be connected to the output terminals of the op-amp 415 of the last integrator of the delta-sigma modulator 200, such as illustrated in FIGS. 17, 19, and 20, or connected to receive an op-amp output of an intermediate integrator (e.g., the second integrator 1700 as illustrated in FIG. 18). An output terminal of the quantizer 1705 may be connected to an input of the digital circuit 205. In various embodiments, the quantizer 1705 may generate a single-bit output value, while other embodiments may generate a multi-bit output value.

The output value of the quantizer 1705 may be used to control the integrators, such as the first integrator 400, the second integrator 1700, the third integrator 1800, and the fourth integrator 1900. For example, the output value of the quantizer 1705 may determine whether the control signal (DA_CTLP) is the positive voltage or the negative voltage, and whether the control signal (DA_CTLN) is a positive voltage or a negative voltage. In various embodiments, one of the control signals (e.g., DA_CTLP) will be a positive voltage and the remaining control signal (e.g., DA_CTLN) will be a negative voltage. The assignment of a negative or positive voltage may be based on design preferences.

Figure 6:
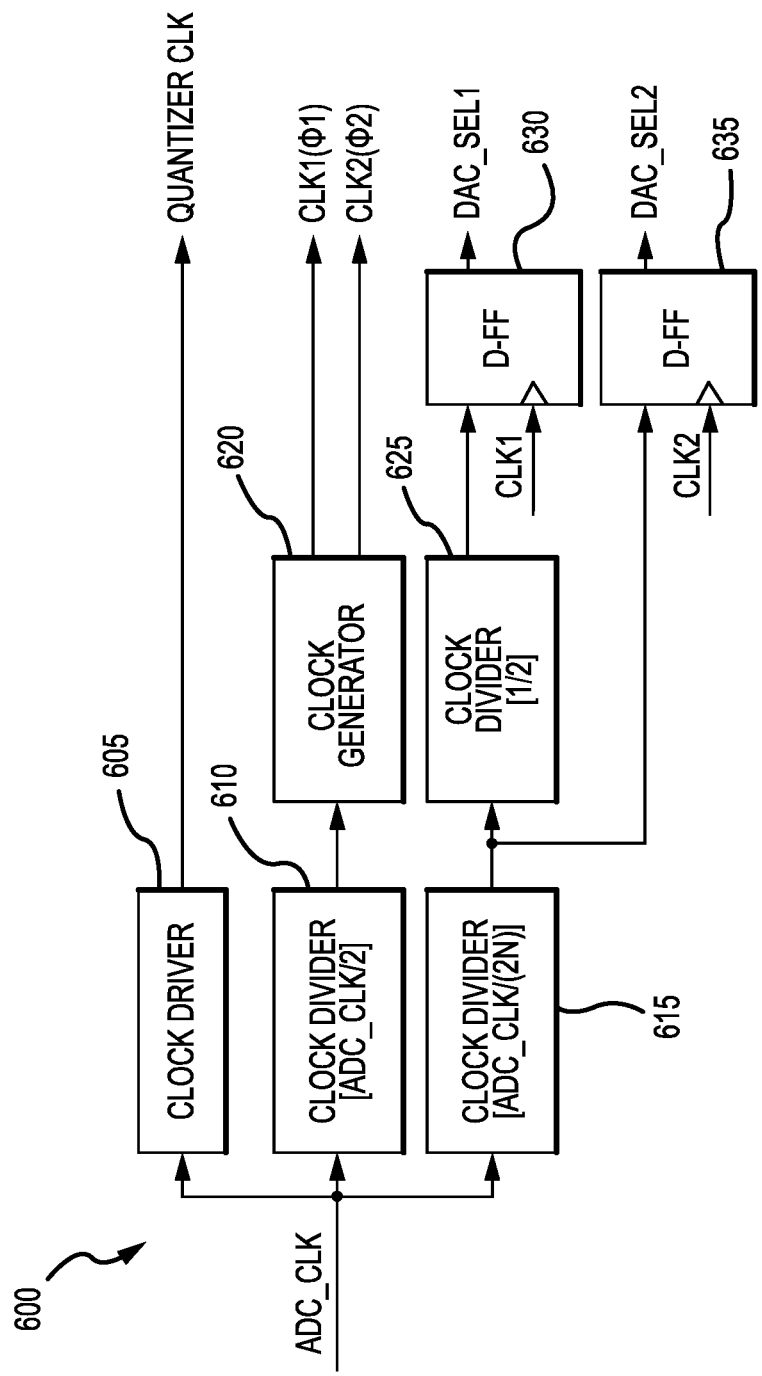
FIG. 6 is a block diagram of a first signal generator circuit in accordance with an exemplary embodiment of the present technology.
Figure 7:
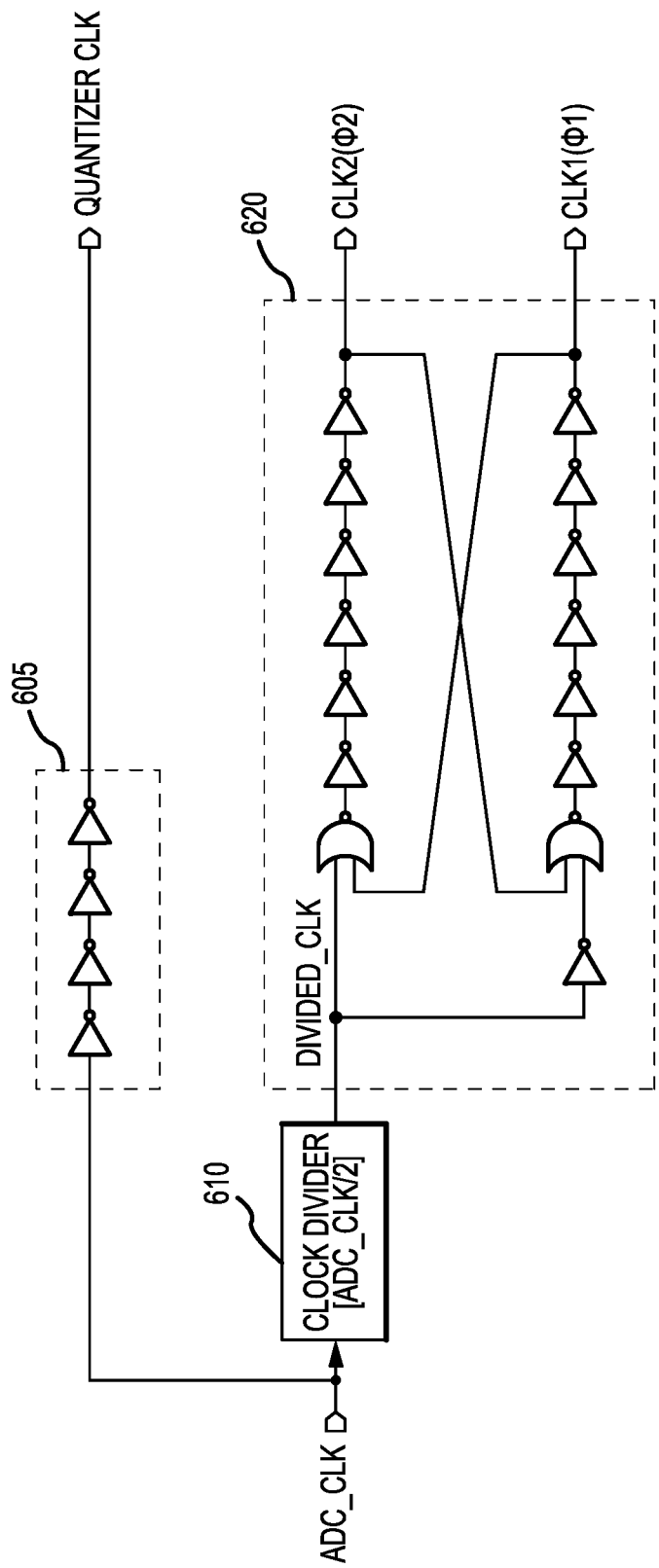
FIG. 7 is a circuit diagram of the first signal generator circuit in accordance with an exemplary embodiment of the present technology.
Figure 8:
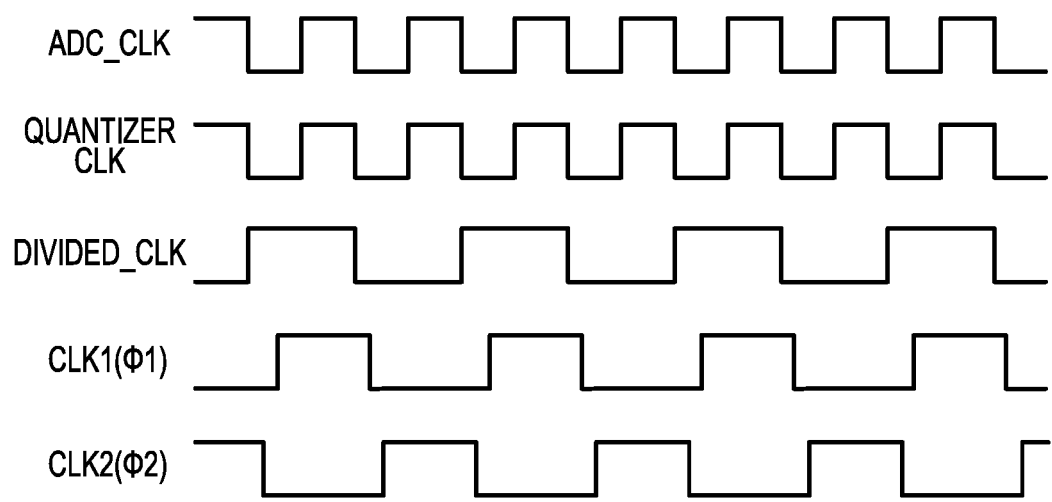
FIG. 8 is a timing diagram of various signals generated by the first signal generator circuit in accordance with an exemplary embodiment of the present technology.

Referring to FIGS. 6, 7, and 8, the audio system 100 may further comprise a second signal generator circuit 600 configured to generate various clock signals and/or digital signals. For example, according to an exemplary embodiment, the second signal generator circuit 600 is configured to generate a quantizer clock signal (quantizer CLK), a first clock signal CLK1 having the first phase 11, a second clock signal having the second phase 12, the first select signal DAC_SEL1, and the second select signal DAC_SEL2. The second signal generator circuit 600 may generate the various clock and/or digital signals according to the reference clock signal ADC_CLK.

According to an exemplary embodiment, the second signal generator circuit 600 may comprise a clock driver circuit 605, a first clock divider circuit 610, a second clock divider circuit 615, a third clock divider circuit 625, a clock generator circuit 620, a first digital circuit 630, and a second digital circuit 635 that operate together to generate the various clock and digital signals.

In an exemplary embodiment, the clock driver circuit 605 may be configured to receive the reference clock signal ADC_CLK and generate the quantizer clock signal. The quantizer clock signal has a same frequency as the frequency of the reference clock ADC_CLK. The clock driver circuit 605 may comprise a plurality of inverters.

The first clock divider circuit 610 may be configured to receive the reference clock signal ADC_CLK and divide the reference clock signal by 2 (i.e., ADC_CLK/2).

The second clock divider circuit 615 may be configured to receive the reference clock signal ADC_CLK and divide the reference clock signal by 2N (i.e., ADC_CLK/2N), where N is a natural number. The second clock divider circuit 615 may transmit its output to an input of the third clock divider circuit 625 and to an input of the second digital circuit 635.

The third clock divider circuit 625 may be connected to receive the output of the second clock divider circuit 615 and divide the output by 2. The output of the third clock divider circuit 625 may be transmitted to the first digital circuit 630.

The clock generator 620 may be connected to an output of the first clock divider circuit 610 and configured to generate the first clock signal CLK1 and the second clock signal CLK2 according to a divided clock signal of the first clock divider circuit 610, wherein the first and second clock signals CLK1, CLK2 have non-overlapping phases. According to an exemplary embodiment, the clock generator circuit 620 may comprise a plurality of logic circuits, such as a plurality of inverters and a plurality of NOR gates.

The first digital circuit 630 may be configured to generate the first select signal DAC_SEL1 according to the first clock signal CLK1 and the output of the third clock divider circuit 625. The second digital circuit 635 may be configured to generate the second select signal DAC_SEL2 according to the second clock signal CLK2 and the output of the second clock divider circuit 615. In an exemplary embodiment, each of the first and second digital circuit 630, 635 may comprise a D-flip flop circuit responsive to the first and second clock signals CLK1, CLK2. The first and second select signals DAC_SEL1 and DAC_SEL2 are output at a positive edge of the first clock signal CLK1 and a positive edge of the second clock signal CLK2, respectively.

Figure 12:
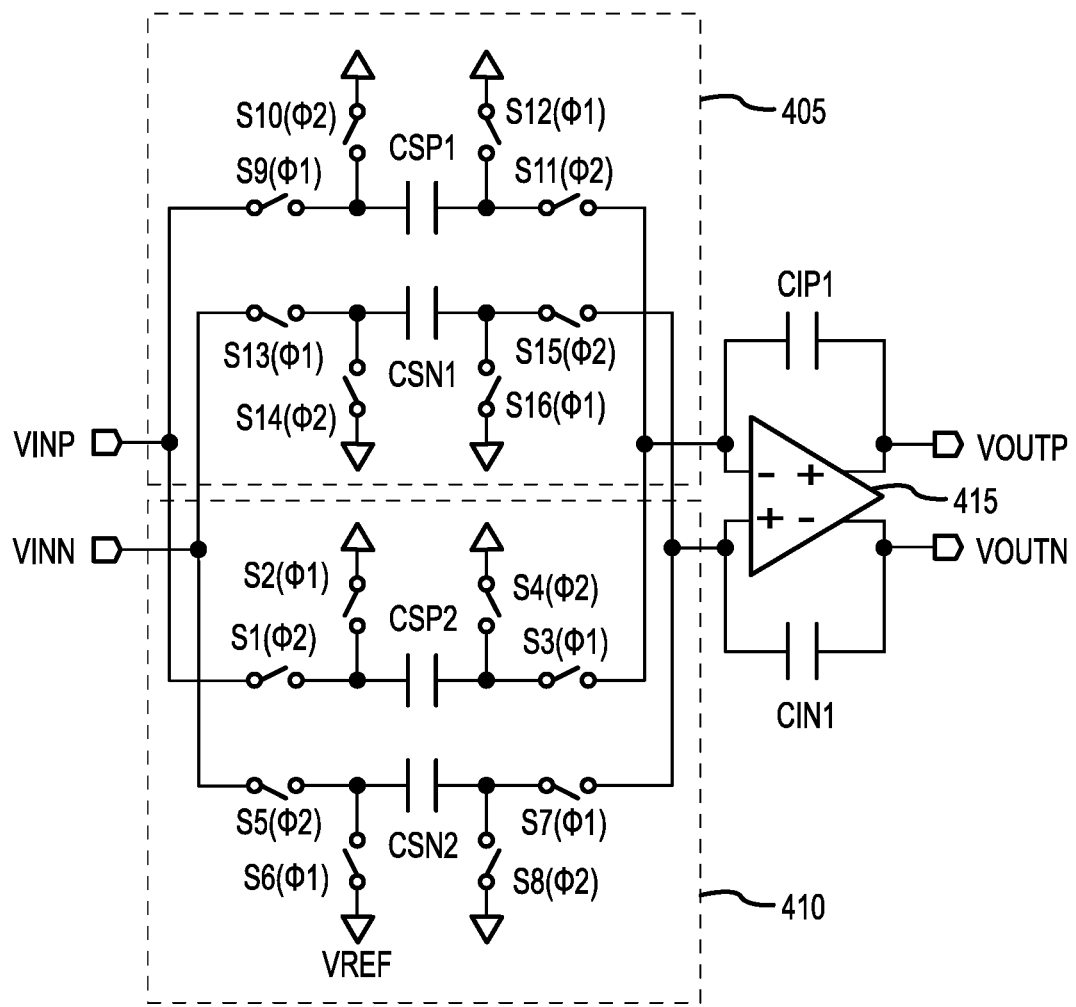
FIG. 12 is a simplified circuit diagram of the integrator circuit of FIG. 4 and in accordance with an exemplary embodiment of the present technology.
Figure 13:
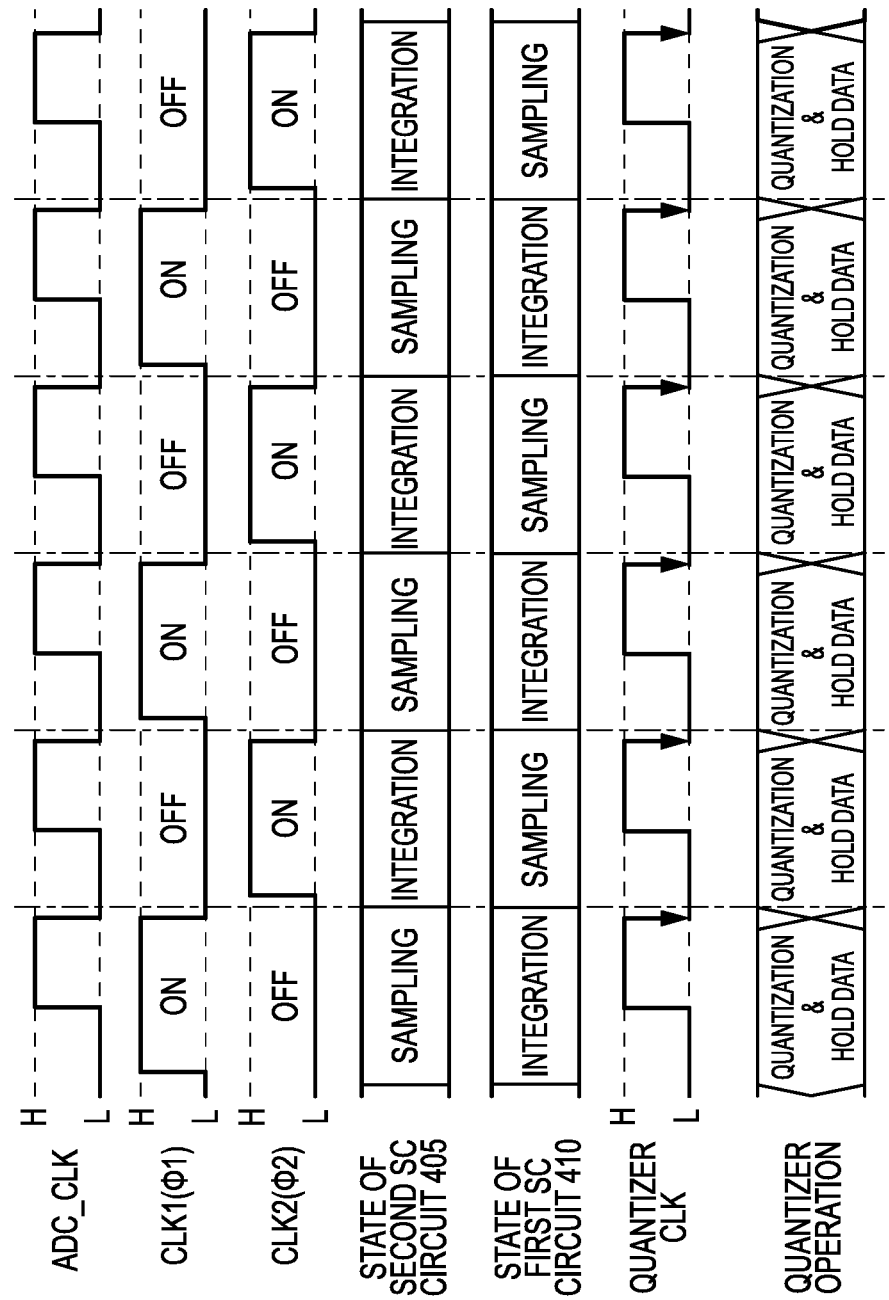
FIG. 13 is a timing diagram of the simplified circuit diagram of FIG. 12 and in accordance with an exemplary embodiment of the present technology.

In operation, and according to various embodiments, each integrator (e.g., the first integrator 400, the second integrator 1700, the third integrator 1800, and the fourth integrator 1900) may operate to perform sampling and integration simultaneously. For example, and referring to FIGS. 12 and 13, while the first SC circuit 405 is performing sampling, the second SC circuit 410 is performing integration and vice versa. In addition, the each integrator operates at a frequency that is half the frequency of the quantization clock signal.

Figure 5:
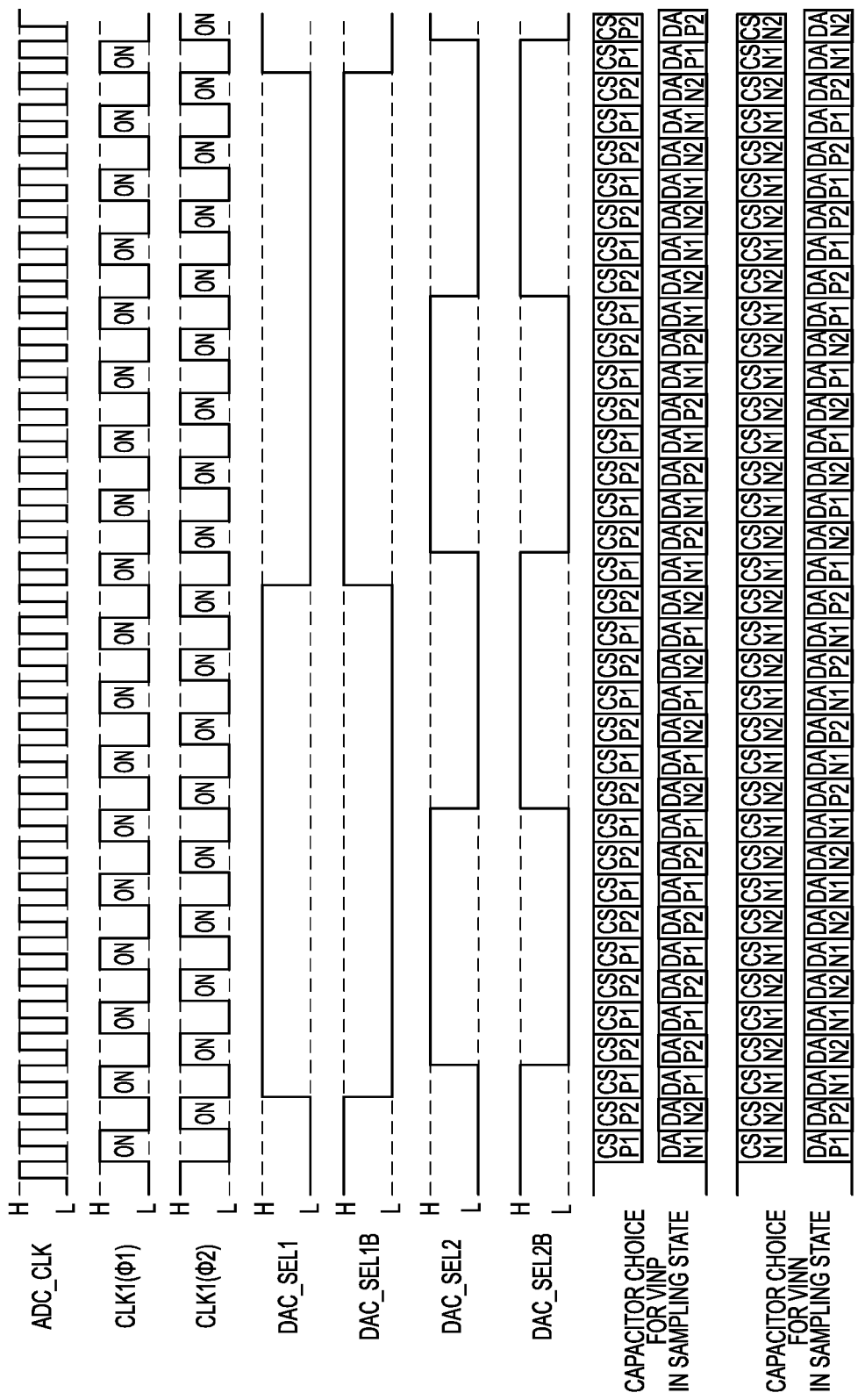
FIG. 5 is a timing diagram of the integrator circuit in accordance with an exemplary embodiment of the present technology.

In addition, and referring to FIGS. 4 and 5, for each clock cycle of the reference clock ADC_CLK, two sampling capacitors are activated along with two feedback DACs 420 according to the first and second clock signals CLK1, CLK2 and the first and second select signals DAC_SEL1, DAC_SEL2. Accordingly, one of the two sampling capacitors is performing sampling while the remaining sampling capacitor is performing integration.

Figure 14A:
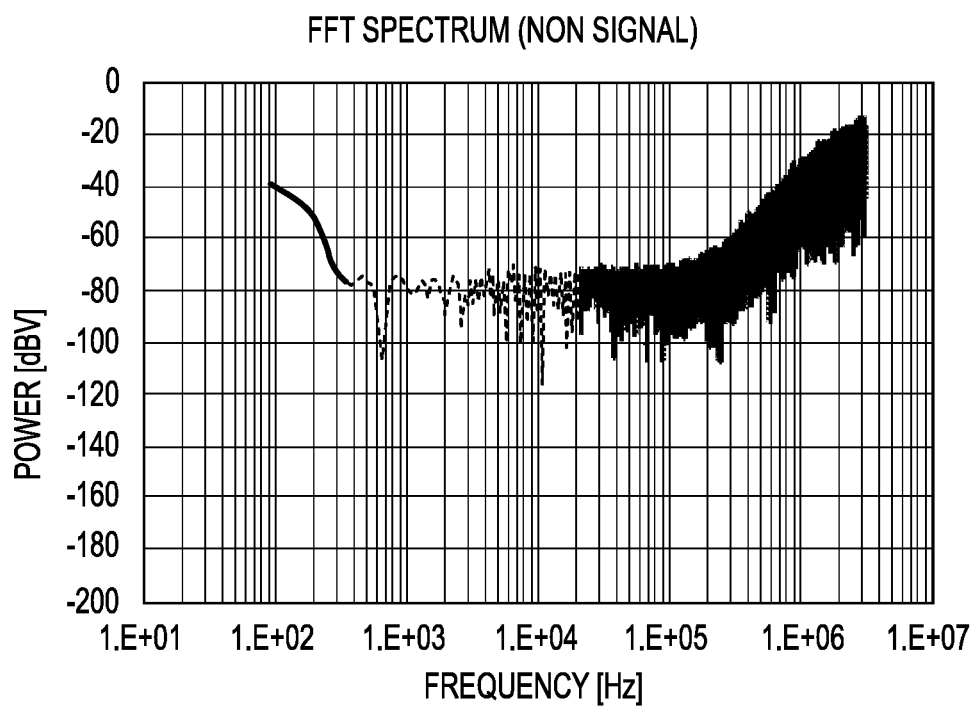
FIG. 14A is a frequency spectrum of a conventional analog-to-digital converter.
Figure 14B:
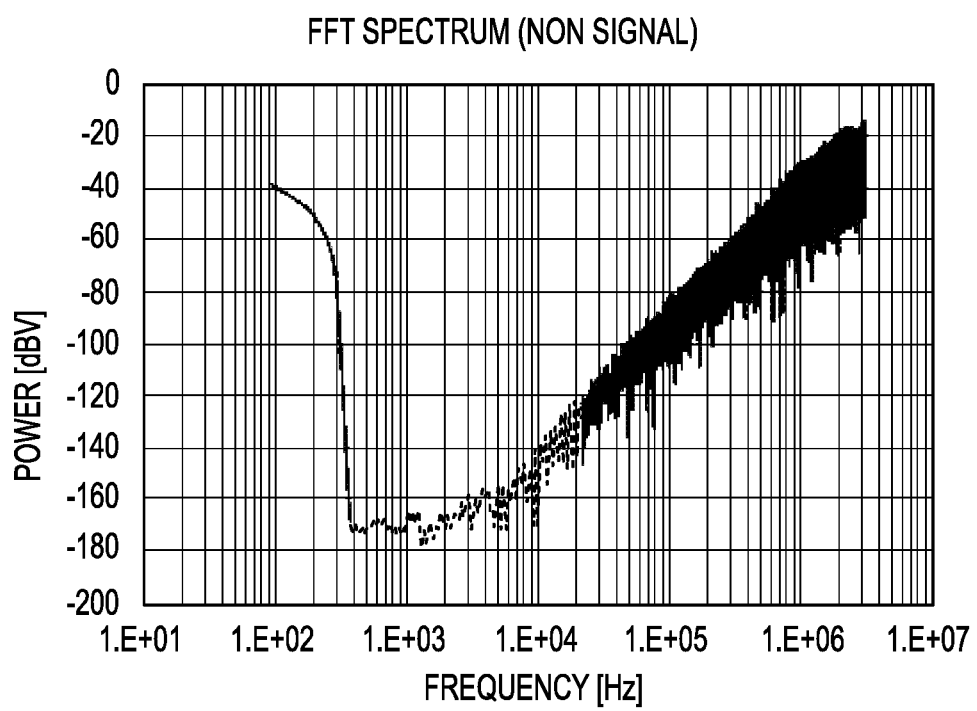
FIG. 14B is a frequency spectrum of the analog-to-digital converter in accordance with an exemplary embodiment of the present technology.
Figure 15A:
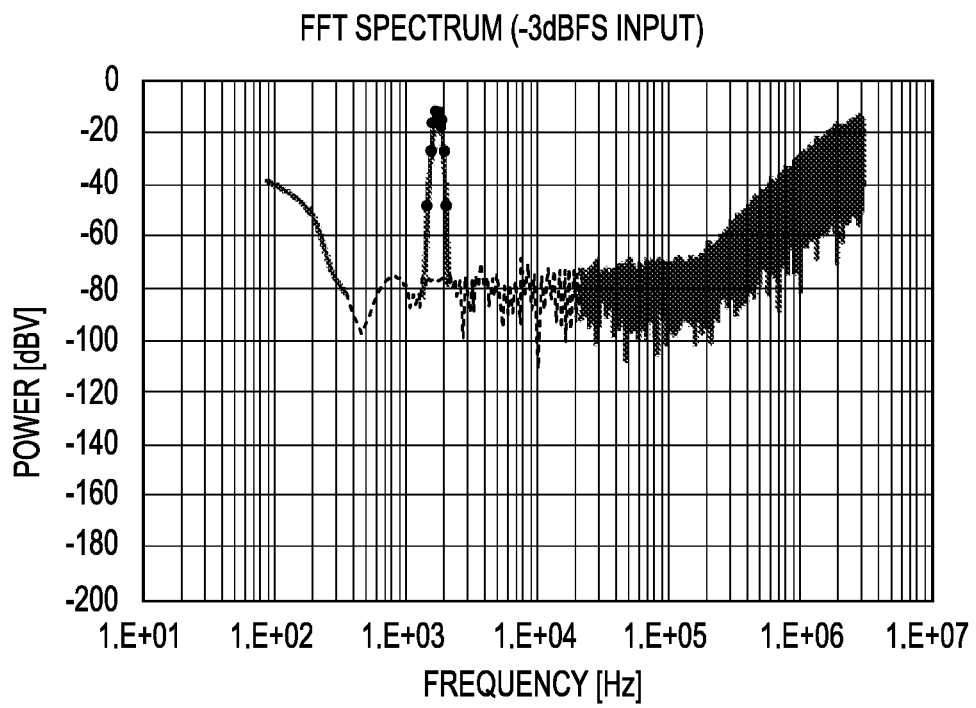
FIG. 15A is a frequency spectrum of a conventional analog-to-digital converter with an input of −3 dB relative to full scale.
Figure 15B:
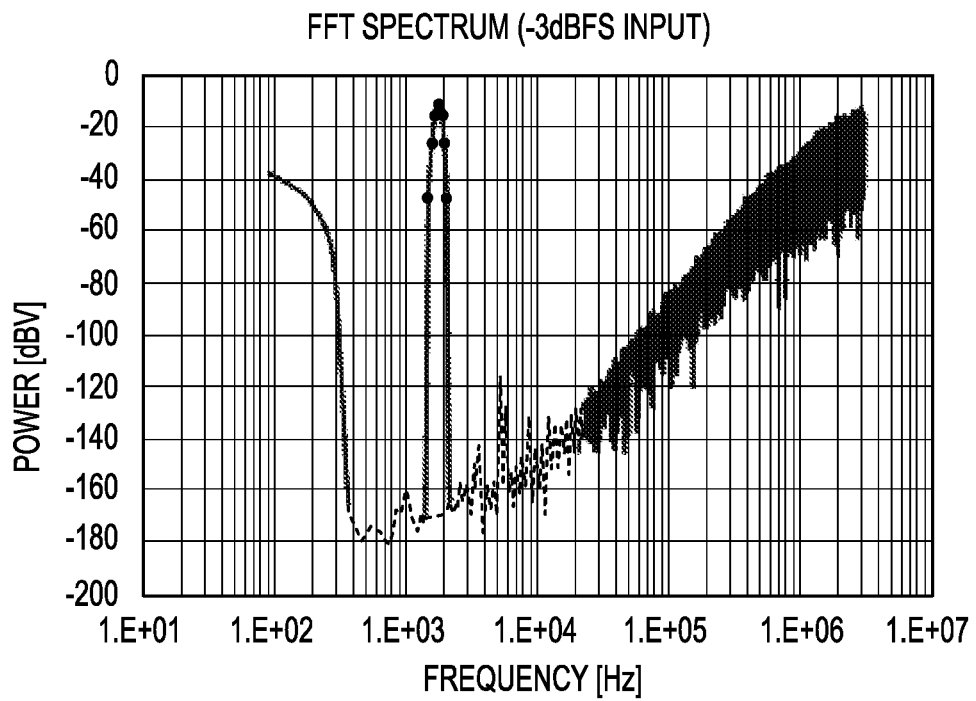
FIG. 15B is a frequency spectrum of the analog-to-digital converter with an input of −3 dB relative to full scale and in accordance with an exemplary embodiment of the present technology.

Referring to FIG. 14A, conventional systems exhibit a significant amount of quantization noise. In contrast, and referring to FIG. 14B, embodiments of the present technology exhibit much less quantization noise than the conventional system. Similarly, and referring to FIGS. 15A-15B, when given a −3 dBFS input signal, the conventional system exhibits a significant amount of quantization noise (FIG. 15A), while embodiments of the present technology exhibit much less quantization noise (FIG. 15B) than the conventional system. The various control signals generated by the first and second signal generator circuits 600, 1000 greatly contribute to a reduction of quantization noise.

Figure 16A:
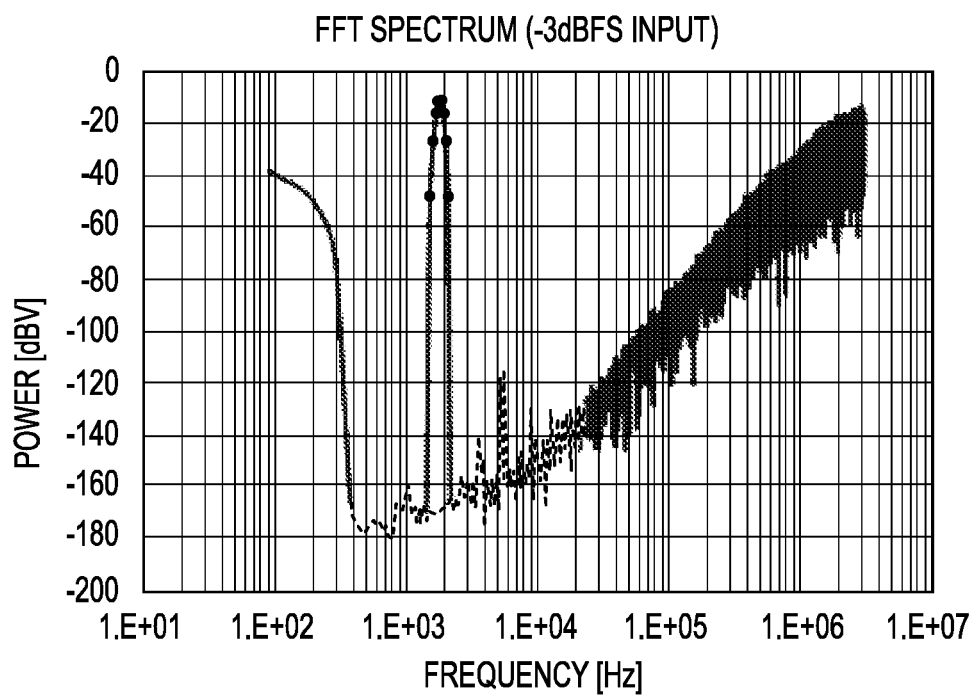
FIG. 16A is a frequency spectrum of the analog-to-digital converter with an input of −3 dB relative to full scale, a bandwidth of 20 kHz, and a sampling frequency of 48 kHz and in accordance with an exemplary embodiment of the present technology.
Figure 16B:
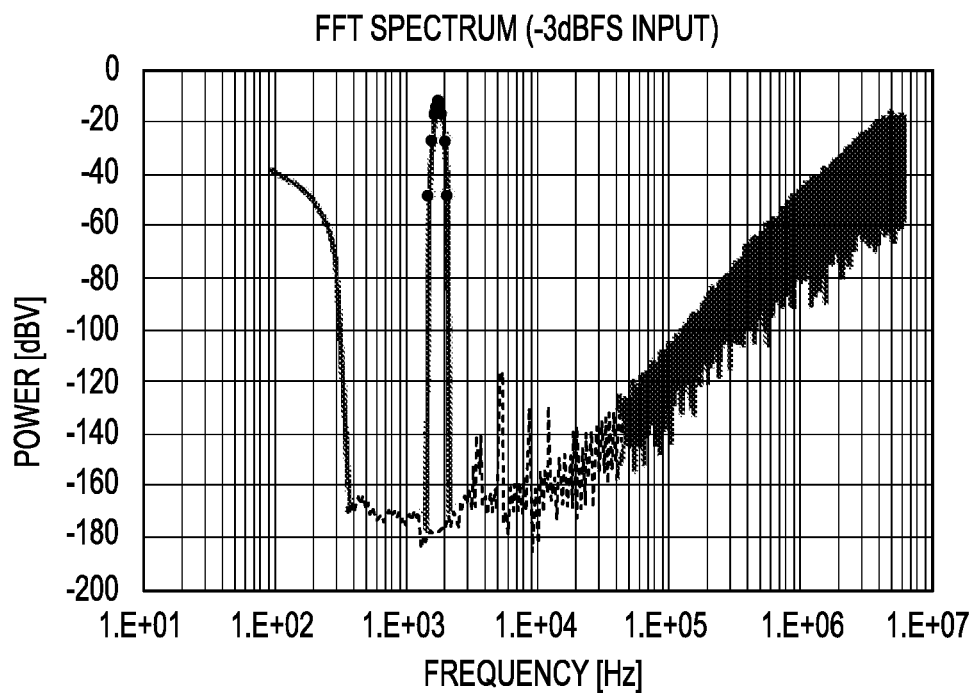
FIG. 16B is a frequency spectrum of the analog-to-digital with an input of −3 dB relative to full scale, a bandwidth of 40 kHz, and a sampling frequency of 96 kHz and in accordance with an exemplary embodiment of the present technology.

Embodiments of the present technology are able to achieve nearly the same characteristics of a conventional (standard) operating frequency without increasing the current. For example, and referring to FIG. 16A, the audio system 100, when given a −3 dBFS input signal and operating at a reference clock of 6.144 MHz (i.e., standard operating frequency), bandwidth of 20 kHz, and sampling frequency of 48 kHz, will produce a particular frequency spectrum. Referring to FIG. 16B, and according to embodiments of the present technology, the audio system 100 will produce the same frequency spectrum as the standard operating frequency, while operating with a reference clock of 12.288 MHz (double the standard operating frequency), a bandwidth of 40 kHz, and a sampling frequency of 96 KHz. In other words, embodiments of the present technology are able to achieve nearly the same characteristics without increasing the current even if the operating frequency is doubled.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A delta-sigma analog-to-digital converter, comprising:
   a first integrator circuit, comprising:
      a first switched-capacitor circuit configured to receive a first input signal and a second input signal and comprising: a first sampling capacitor and a second sampling capacitor;
      a second switched-capacitor circuit configured to receive the first input signal and the second input signal and comprising: a third sampling capacitor and a fourth sampling capacitor;
      a first amplifier comprising a first non-inverting input terminal and a first inverting input terminal, wherein:
         the first switched-capacitor circuit is connected to the first non-inverting input terminal and the first inverting input terminal; and
         the second switched-capacitor circuit is connected to the first non-inverting input terminal and the first inverting input terminal;
      a first pair of digital-to-analog converters selectively connected to the first and second sampling capacitors; and
      a second pair of digital-to-analog converters selectively connected to the third and fourth sampling capacitors.

2. The delta-sigma analog-to-digital converter according to claim 1, further comprising a second integrator circuit connected in series with the first integrator circuit, wherein the second integrator circuit comprises:
   a third switched-capacitor circuit;
   a fourth switched-capacitor circuit; and
   a second amplifier comprising a second non-inverting input terminal and a second inverting input terminal, wherein:
      the third switched-capacitor circuit is connected to the second non-inverting input terminal and the second inverting input terminal; and
      the fourth switched-capacitor circuit is connected to the second non-inverting input terminal and the second inverting input terminal.

3. The delta-sigma analog-to-digital converter according to claim 2, wherein the second integrator circuit further comprises: a plurality digital-to-analog converters responsive to a control signal and directly connected to at least one of the third and fourth switched-capacitor circuits.

4. The delta-sigma analog-to-digital converter according to claim 2, further comprising a quantizer connected directly to an output terminal of the second amplifier and configured to generate a digital output value.

5. The delta-sigma analog-to-digital converter according to claim 4, wherein:
the delta-sigma analog-to-digital converter operates according to a reference clock signal having a first frequency;
the quantizer operates according to a quantizer clock signal having the first frequency; and
the first and second switched-capacitor circuits operate according to a first clock signal and a second clock signal, wherein the first clock signal and the second clock signal are non-overlapping signals having a second frequency that is half that of the first frequency.

6. The delta-sigma analog-to-digital converter according to claim 4, further comprising a plurality digital-to-analog converters responsive to the digital output value of the quantizer and connected to at least one of the first and second switched-capacitor circuits.

7. The delta-sigma analog-to-digital converter according to claim 1, further comprising a plurality of digital-to-analog converters connected to at least one of the first and second switched-capacitor circuits via a switch.

8. The delta-sigma analog-to-digital converter according to claim 7, wherein each digital-to-analog converter from the plurality of digital-to-analog converters is responsive to a control signal based on a quantizer output, a first digital signal based on a reference clock, and a second digital signal based on the reference clock.

9. A method for operating an analog-to-digital converter, comprising:
performing integration using a first switched-capacitor circuit, comprising a first sampling capacitor and a second sampling capacitor, and according to a first clock signal;
performing sampling using a second switched-capacitor circuit, comprising a third sampling capacitor and a fourth sampling capacitor, and according to a second clock signal;
wherein:
the first clock signal and the second clock signal are non-overlapping signals having a first frequency; and
integration and sampling are performed simultaneously.

10. The method according to claim 9, wherein the analog-to-digital converter operates according to a reference clock having a second frequency.

11. The method according to claim 10, further comprising performing quantization according to a quantizer clock having a third frequency that is the same as the second frequency.

12. The method according to claim 11, wherein the first frequency is half of the third frequency.

13. A system, comprising:
a signal generator circuit configured to generate:
a first clock signal and a second clock signal according to a reference clock signal having a first frequency, wherein the first and second clock signals are non-overlapping signals having a second frequency that is half that of the first frequency; and
a quantizer clock signal according to the reference clock signal, wherein the quantizer clock signal has the first frequency; and an analog-to-digital converter in communication with the signal generator circuit, and comprising:
a first integrator circuit comprising four sampling capacitors and configured to simultaneously perform integration and sampling according to the first clock signal and the second clock signal;
a second integrator circuit connected in series with the first integrator circuit and configured to simultaneously perform integration and sampling according to the first clock signal and the second clock signal; and
a quantizer connected to an output of the second integrator circuit and configured to:
perform quantization according to the quantizer clock signal having the first frequency; and
generate a digital output.

14. The system according to claim 13, wherein the first integrator circuit comprises:
a first switched-capacitor circuit configured to receive a first input signal and a second input signal;
a second switched-capacitor circuit configured to receive the first input signal and the second input signal; and
a first amplifier comprising a first non-inverting input terminal and a first inverting input terminal, wherein:
the first switched-capacitor circuit is connected to the first non-inverting input terminal and the first inverting input terminal; and
the second switched-capacitor circuit is connected to the first non-inverting input terminal and the first inverting input terminal.

15. The system according to claim 14, further comprising a plurality of digital-to-analog converters connected to at least one of the first and second switched-capacitor circuits via a switch, wherein each digital-to-analog converter from the plurality of digital-to-analog converters is responsive to:
a control signal based on the digital output of the quantizer,
a first digital signal based on the reference clock signal, and
a second digital signal based on the reference clock signal.

16. The system according to claim 13, wherein the second integrator circuit comprises:
a third switched-capacitor circuit;
a fourth switched-capacitor circuit; and
a second amplifier comprising a second non-inverting input terminal and a second inverting input terminal, wherein:
the third switched-capacitor circuit is connected to the second non-inverting input terminal and the second inverting input terminal; and
the fourth switched-capacitor circuit is connected to the second non-inverting input terminal and the second inverting input terminal.

17. The system according to claim 16, wherein the second integrator circuit further comprises: a plurality digital-to-analog converters directly connected to at least one of the third and fourth switched-capacitor circuits and responsive to a control signal that is based on the digital output of the quantizer.

18. The system according to claim 13, wherein:
the first integrator circuit comprises four digital-to-analog converters, each selectively connected to two of the four sampling capacitors.

* * * * *